(12) United States Patent
Sato

(10) Patent No.: US 7,993,978 B2
(45) Date of Patent: Aug. 9, 2011

(54) METHOD OF MANUFACTURING A SEMICONDUCTOR DEVICE AND MOLDING DIE

(75) Inventor: Yuko Sato, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 133 days.

(21) Appl. No.: 12/453,338

(22) Filed: May 7, 2009

(65) Prior Publication Data

US 2009/0291531 A1 Nov. 26, 2009

(30) Foreign Application Priority Data

May 26, 2008 (JP) .................................. 2008-137130

(51) Int. Cl.
*H01L 21/44* (2006.01)
*H01L 23/495* (2006.01)

(52) U.S. Cl. ........ 438/122; 438/112; 438/117; 438/127; 257/675; 257/706; 257/717; 257/796

(58) Field of Classification Search .................. 438/112, 438/117, 122, 124, 126, 127; 257/675, 706, 257/707, 712, 717, 718, 787, 796

See application file for complete search history.

(56) References Cited

U.S. PATENT DOCUMENTS

| | | | | |
|---|---|---|---|---|
| 5,147,821 A * | 9/1992 | McShane et al. | ............. | 438/122 |
| 6,258,630 B1 * | 7/2001 | Kawahara | ...................... | 438/122 |
| 6,400,014 B1 * | 6/2002 | Huang et al. | ................... | 257/712 |
| 6,432,742 B1 * | 8/2002 | Guan et al. | ..................... | 438/106 |
| 6,787,093 B2 * | 9/2004 | Kiritani | .......................... | 438/126 |
| 6,815,261 B2 * | 11/2004 | Mess | .............................. | 438/126 |
| 7,030,505 B2 * | 4/2006 | Kimura | ......................... | 257/796 |

FOREIGN PATENT DOCUMENTS

| | | |
|---|---|---|
| JP | 2000-349203 | 12/2000 |
| JP | 2004-96094 | 3/2004 |

* cited by examiner

*Primary Examiner* — Kevin M Picardat
(74) *Attorney, Agent, or Firm* — McGinn IP Law Group, PLLC

(57) ABSTRACT

A method of manufacturing a semiconductor device capable of obtaining high joining force between a heat spreader and resin is provided. The method of manufacturing a semiconductor device according to the present invention includes: setting a heat spreader 60 on a face formed a plurality of apertures 22 in a cavity 21 of a first molding die 14; filling resin 20 into the cavity; setting a substrate 54 mounted with a semiconductor chip 50 a second molding die 12; and pressure-welding the first molding die 14 and the second molding die 12 so that the semiconductor chip is embedded in the resin 20, wherein a plurality of concave portion is formed on one face of the heat spreader 60, a plurality of convex portions is formed on the other face of the heat spreader 60, and the plurality of concave portions and the plurality of convex portions are overlapped in plan view.

18 Claims, 6 Drawing Sheets

METHOD OF MANUFACTURING A SEMICONDUCTOR DEVICE AND MOLDING DIE

BACKGROUND OF THE INVENTION

1. Field of the Invention

The present invention relates to a method of manufacturing a semiconductor device, and a molding die.

2. Description of the Related Art

As a related technique, Japanese Patent Laid-Open No. 2004-96094 describes an invention of a molding die for seal-molding a BGA (Ball Grid Array) package with molding resin.

The molding die causes a ceiling face of a cavity to bulge at an upper part of a semiconductor chip, and by joining the ceiling face of the cavity to the molding resin while curving a heat sink (heat spreader), prevents warpage of a semiconductor substrate due to shrinkage of the molding resin over time.

To this end, during seal-molding of the semiconductor chip, an inner face of the cavity of an upper molding die is shaped as an upward convex and an adsorption hole opposing the center of the heat spreader is vacuum-suctioned to bend the heat spreader so that the center of the heat spreader bulges and curves fully.

Japanese Patent Laid-Open No. 2000-349203 describes an invention of a so-called flip-chip semiconductor device which improves the joint strength between molding resin and a heat spreader by forming, in advance, asperities around an area that abuts a flip chip among a bottom face of the heat spreader (particularly, refer to FIG. 11 of Japanese Patent Laid-Open No. 2000-349203).

While the invention described in Japanese Patent Laid-Open No. 2004-96094 is arranged to absorb an overall shrinkage of the molding resin by deflecting the entire heat spreader in a bow-shape, the invention is incapable of producing sufficient adhesion between the heat spreader and the molding resin.

The invention described in Japanese Patent Laid-Open No. 2000-349203 relates to a flip-chip semiconductor device. Accordingly, the heat spreader is joined to an upper face of the flip chip and asperities are only formed on a part thereof. In addition, the molding resin does not seal the entire flip chip and the joining pressure between the heat spreader and the molding resin is generally not high. Therefore, even with the invention of Japanese Patent Laid-Open No. 2000-349203, sufficient adhesion between the heat spreader and the molding resin cannot be obtained.

SUMMARY

A method of manufacturing a semiconductor device according to the present invention includes: setting a heat spreader on a face formed a plurality of apertures in a cavity of a first molding die; filling resin into the cavity; setting a substrate mounted with a semiconductor chip a second molding die; and pressure-welding the first molding die and the second molding die so that the semiconductor chip is embedded in the resin, wherein a plurality of concave portions is formed on one face of the heat spreader, a plurality of convex portions is formed on the other face of the heat spreader, and the plurality of concave portions and the plurality of convex portions are overlapped in plan view.

According to the invention described above, when pressure-welding the resin filling the cavity and the heat spreader, the heat spreader bulges out together with the resin in localized areas corresponding to the apertures to form protrusions. Accordingly, bulging protrusions and flat sections outside of the protrusions coexist on the joining face of the heat spreader and the resin. Therefore, since the heat spreader and the resin are joined together with a large joining area and any expansion of peeling of the heat spreader is to be stopped by the protrusions, the heat spreader and the resin are tightly joined with a high joining force. As a result, with a semiconductor device manufactured according to the present invention, high peeling strength and favorable thermal conductivity can be obtained between the heat spreader and the resin.

A molding die according to the present invention is a molding die for resin-sealing a substrate on which a semiconductor chip is mounted and includes a first molding die having a cavity for filling resin and a second molding die for setting the substrate, wherein the first molding die has a plurality of apertures on a face for setting a planar heat spreader.

The use of the molding die described above realizes the method of manufacturing a semiconductor device according to the present invention. In addition, the use of the molding die realizes a favorable joint between the heat spreader and the resin. Consequently, according to the present invention, since the molding die can be used versatilely regardless of a package size of a semiconductor device, there is no need to individually design and fabricate a molding die for each semiconductor device type or frequently replace the molding die during seal-molding.

In the invention described above, the uniform dispersion of apertures on the opposing face refers to a state in which, for each semiconductor device package to be seal-molded, there are no extreme imbalances in the number of corresponding apertures. Rigid regularity or uniformity of the formation positions of the apertures is not required insofar as realizing the effects of the present invention.

Moreover, the various components of the present invention including the molding die need not necessarily be individually independent entities. Instead, a plurality of components may be formed as a single member; a single component may be formed by a plurality of members; a component may be a part of another component; a part of a component may double as a part of another component, and the like.

In addition, while a plurality of steps is to be described in a sequence when explaining the method of manufacturing a semiconductor device according to the present invention, unless explicitly indicated, the described sequence does not necessarily limit a sequence in which the steps are to be executed. Furthermore, unless explicitly indicated, the plurality of steps is not limited to being individually executed at different timings and, alternatively, a step may be initiated during the execution of another step, the timing of execution of a step may partially or entirely overlap with the timing of execution of another step, and the like. Example of the above include: the sequential relationship between a step in which the substrate is set on the first molding die and a step in which the heat spreader is set on the second molding die; the sequential relationship between a step in which the substrate is set on the first molding die and a step in which molding resin is filled into the cavity, and the like.

With the method of manufacturing a semiconductor device and the molding die to be used therein according to the present invention, strong joining force between the heat spreader and the molding resin can be obtained. In addition, since the heat spreader and the molding resin are joined by such strong joining force, a semiconductor device according to the present invention is highly resistant to peeling of the heat spreader and the molding resin, and since high thermal conductivity is obtained, heat generated on the semiconductor chip can be favorably diffused and discharged by the heat spreader.

BRIEF DESCRIPTION OF THE DRAWINGS

FIG. 3A is a plan view of a second molding die according to the first embodiment, while

FIG. 4A is a lateral view of a substrate mounted with semiconductor chips, while

FIG. 7A is a plan view of a second molding die according to a second embodiment of the present invention, while

DETAILED DESCRIPTION OF THE PREFERRED EMBODIMENTS

Figure 1:
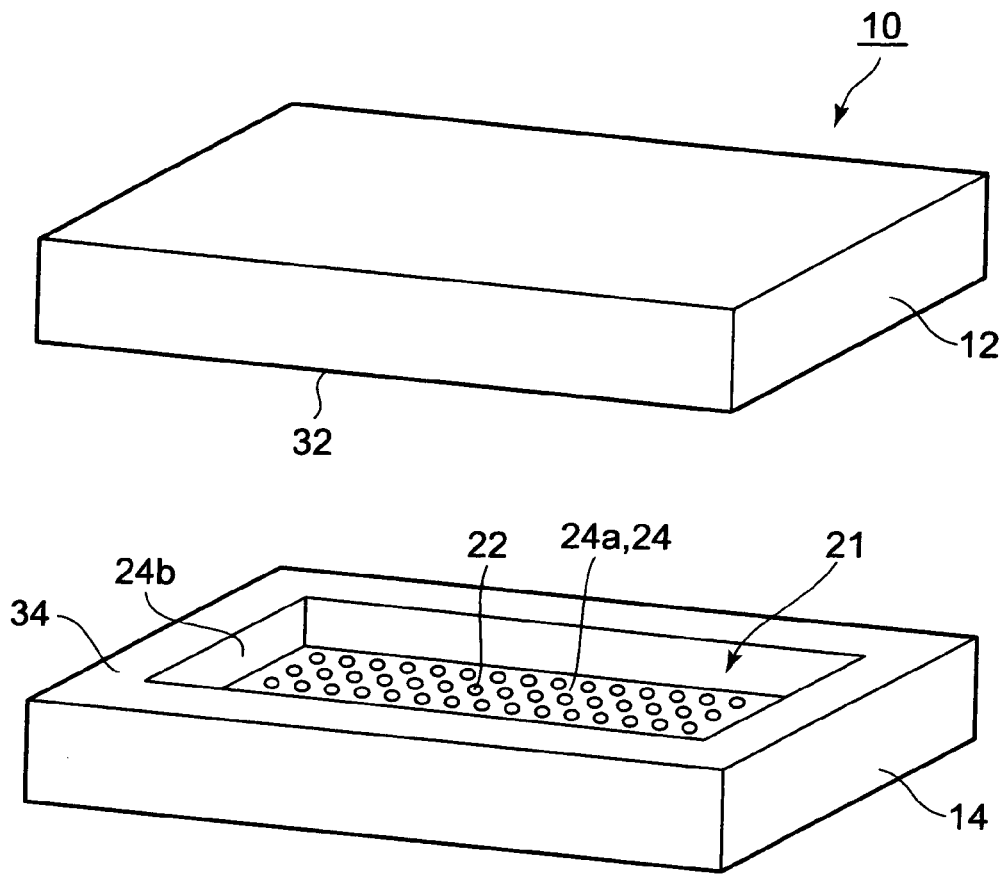
FIG. 1 is a perspective view showing an example of a molding die according to a first embodiment of the present invention.

Embodiments of the present invention will now be described with reference to the drawings. In all of the drawings, like components shall be denoted with like reference characters and descriptions thereof shall be omitted as deemed appropriate.

First Embodiment

Figure 2:
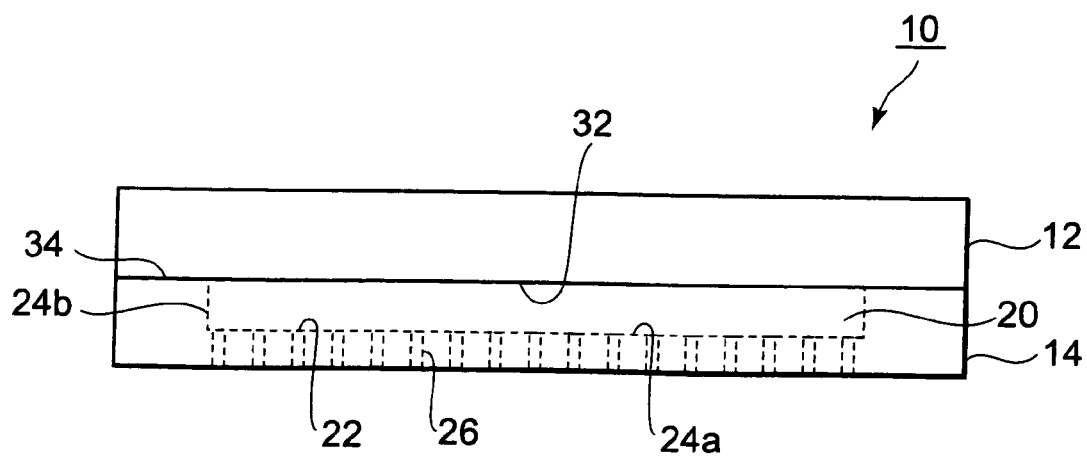
FIG. 2 is a lateral view of a molding die according to the first embodiment.

FIG. 1 is a perspective view showing an example of a molding die 10 according to the present embodiment. The molding die 10 is used by combining a second molding die 12 and a first molding die 14. FIG. 2 is a lateral view of the molding die 10 joining the second molding die 12 and the first molding die 14.

Figure 3A:
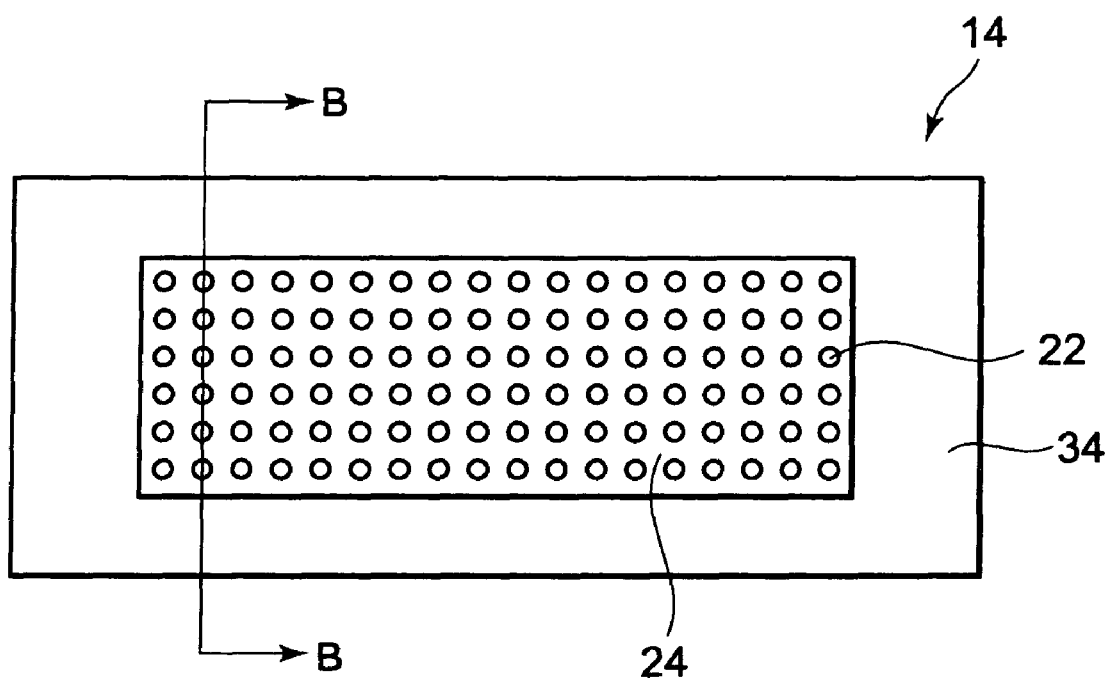
Figure 3B:
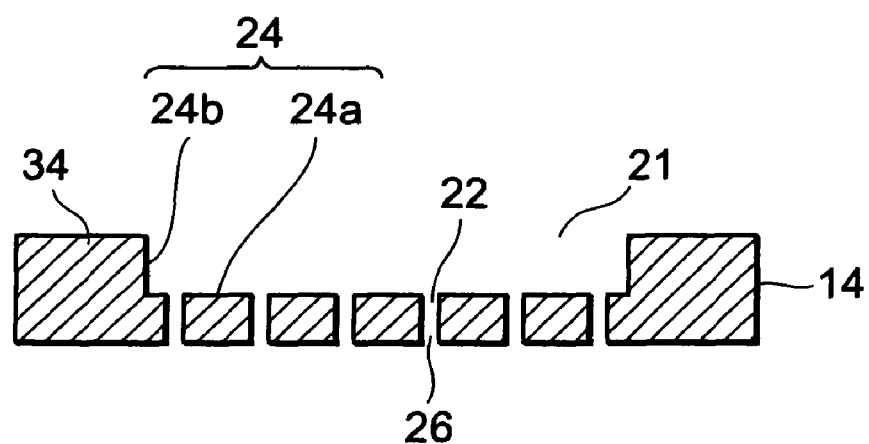
FIG. 3B is a B-B cross sectional view thereof.

FIG. 3A is a plan view of the first molding die 14 according to the present embodiment, while FIG. 3B is a B-B cross sectional view thereof.

Figure 4A:
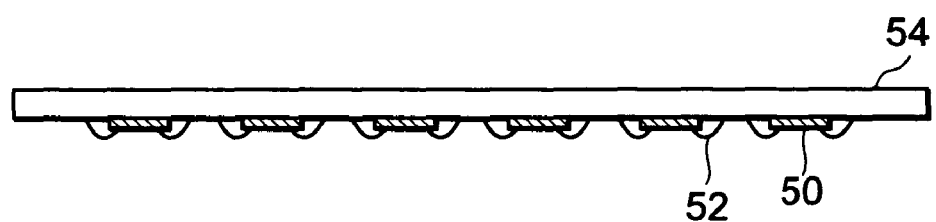
Figure 4B:
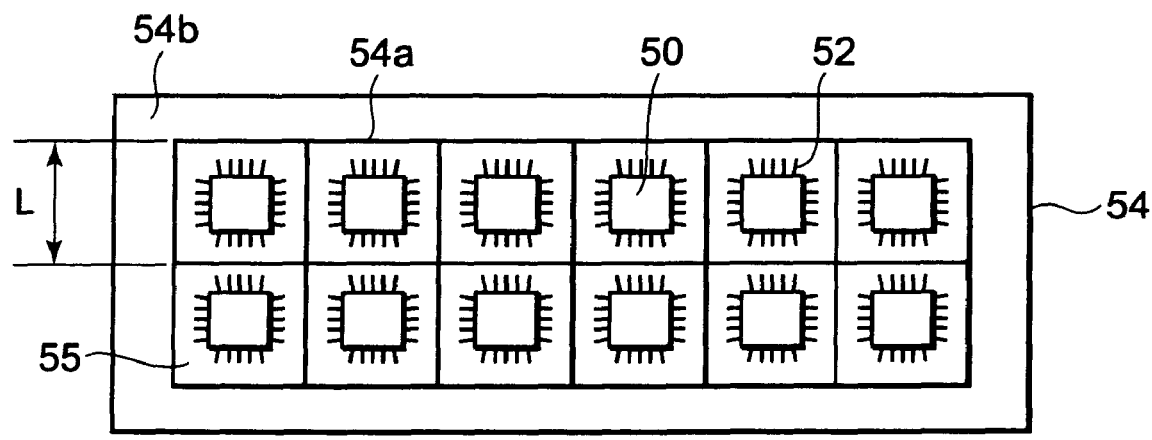
FIG. 4B is a plan view thereof.

FIG. 4A is a lateral view of a substrate 54 on which semiconductor chips 50 seal-molded by the molding die 10 according to the present embodiment are mounted, while FIG. 4B is a plan view (bottom view) thereof.

First, an overview of the molding die 10 according to the present embodiment will be given.

The molding die 10 includes: the second molding die 12 on which the substrate 54 mounted with the semiconductor chips 50 is set; and the first molding die 14 that forms a cavity 20 when combined with the second molding die 12. The molding die 10 seal-molds one or more semiconductor devices 80 (refer to FIG. 5) by sealing the semiconductor chips 50 with molding resin 70 (refer to FIG. 5) which fills the cavity 20.

In addition, the molding die 10 includes a plurality of apertures 22 dispersion-formed at an pitch that is smaller than a unit package size L of the semiconductor device 80 to be molded on a cavity inner face 24 of the first molding die 14.

Next, the molding die 10, a method of manufacturing the semiconductor device 80 using the same, and the semiconductor device 80 will be described in detail.

<Molding Die>

The second molding die 12 and the first molding die 14 are respectively made of a metallic material such as iron, and by joining a pressing face (first pressing face 32) of the second molding die 12 and a pressing face (second pressing face 34) of the first molding die 14, the cavity 20 is formed inside the molding die 10. Both the second molding die 12 and the first molding die 14 may be provided with a cavity recess or, alternatively, one of the molding dies may be planar while only the other is provided with a cavity recess.

In the present embodiment, a cavity recess 21 having a rectangular parallelepiped shape is provided on the first molding die 14 while the second molding die 12 is given a planar shape.

The cavity inner face 24 of the first molding die 14 is made up of an opposing face 24a that is a bottom face of the cavity recess 21 and a peripheral face 24b erected around the opposing face 24a. By joining the second molding die 12 and the first molding die 14, the cavity 20 is formed as a spatial area enclosed by the flat first pressing face 32 of the second molding die 12 and the cavity inner face 24 of the first molding die 14.

A semiconductor package is molded by housing the molding resin 70, together with the semiconductor chip 50 and a heat spreader 60, inside the cavity 20 and loading sealing pressure on the molding die 10.

The molding die 10 according to the present embodiment integrally molds a plurality of semiconductor packages by collectively seal-molding a plurality of semiconductor chips 50 using a MAP (Mold Array Package) method.

The MAP method refers to a method of manufacturing a semiconductor device by simultaneously sealing a plurality of semiconductor chips with molding resin to integrally mold a plurality of semiconductor packages, and singulating the semiconductor packages by dicing in a subsequent step.

The heat spreader 60 according to the present embodiment is then joined to an upper face of a semiconductor package or, in other words, to a position opposing the semiconductor chip 50.

In the present embodiment, among the cavity inner face 24 of the first molding die 14, a plurality of apertures 22 are dispersion-formed on the opposing face 24a opposing the semiconductor chip 50.

In addition, a part of or all of the plurality of apertures 22 communicates with the outside of the cavity of the first molding die 14. In other words, vents 26 are provided on the first molding die 14, whereby one end of the vents 26 is provided on the outside of the first molding die 14 while the other end is formed as apertures 22 on the opposing face 24a of the cavity recess 21.

By releasing sealing pressure loaded on the heat spreader 60, the apertures 22 cause localized bulging of the heat spreader 60 together with the molding resin 70. In other words, the heat spreader 60 loaded with prescribed sealing pressure abuts in its entirety the flat opposing face 24a while causing only areas facing the apertures 22 to bulge locally. In addition, the heat spreader 60 generates just the right amount of deformation at the apertures 22 for the sealing pressure and elastic restoring force to balance out.

The heat spreader 60 is set with the apertures 22 of the opposing face 24a covered. This prevents the molding resin 70 from leaking out of the apertures 22.

Alternatively, the heat spreader 60 may be directly placed on the opposing face 24a, or a film member to which the heat spreader 60 is joined may be placed on the opposing face 24a.

By suctioning the vents 26 communicating with the outside of the first molding die 14, the heat spreader 60 can be adsorbed to and held at the apertures 22.

The vents 26 provided on the first molding die 14 may either be a straight unbranched conduit as shown in FIG. 2, or a branched conduit that branches in mid-course and whose branches respectively communicate with a plurality of apertures 22.

The apertures 22 are provided on a face that adsorbs and holds the heat spreader 60 among the cavity inner face 24. In the present embodiment, since the planar heat spreader 60 is set only on the opposing face 24a and is to be pressure-welded with the molding resin 70, the apertures 22 are provided only on the opposing face 24a.

In contrast, in a case where the heat spreader 60 is joined not only on an upper face of the molding resin 70 opposing the semiconductor chip 50 but also on a lateral face of the molding resin 70 such as when individually seal-molding a semiconductor package, the heat spreader 60 is set beforehand on the opposing face 24a and the peripheral face 24b of the first molding die 14 prior to being pressure-welded with the molding resin 70. Therefore, in such a case, the apertures 22 should be formed on both the opposing face 24a and the peripheral face 24b among the cavity inner face 24.

Modes of the formation of the apertures 22 including specific positions, shapes, dimensions and the like will be described later.

<Semiconductor Chip and Substrate>

A product area 54a and a surrounding clamp area 54b are demarcated on the substrate 54 shown in FIG. 4. In the present embodiment, the product area 54a is further both vertically and horizontally demarcated into a plurality of unit product areas 55. A unit product area 55 is a square whose side length corresponds to the unit packet size L.

As shown in FIG. 4, the product area 54a according to the present embodiment has a longitudinal dimension of two times the unit package size L and a horizontal dimension of six times the unit package size L. However, in the present invention, when individually seal-molding the semiconductor chip 50, the product area 54a need only include one unit product area 55. In addition, when collectively seal-molding a plurality of semiconductor chips 50, a plurality of unit product areas 55 other than the aforementioned may be provided. Moreover, in the present invention, the shape of the unit product area 55 need not be limited to a square and may instead be a rectangle having short and long sides. In this case, the length of the short side is assumed to be the unit packet size L.

While the unit package size L varies depending on the semiconductor device 80, the unit package size L is typically 5 to 50 mm.

A lead wiring and a metal pad (both not shown) are formed on the substrate 54 for each unit product area 55. In addition, the semiconductor chip 50 is mounted for each unit product area 55 and bonded to the substrate 54 by a wire 52.

Therefore, the semiconductor device 80 to be seal-molded by the molding die 10 according to the present embodiment is of a so-called wire-bonding type. A resin member such as glass epoxy resin or aramid resin can be used as the substrate 54.

<Method of Manufacturing a Semiconductor Device>

Figure 5A:
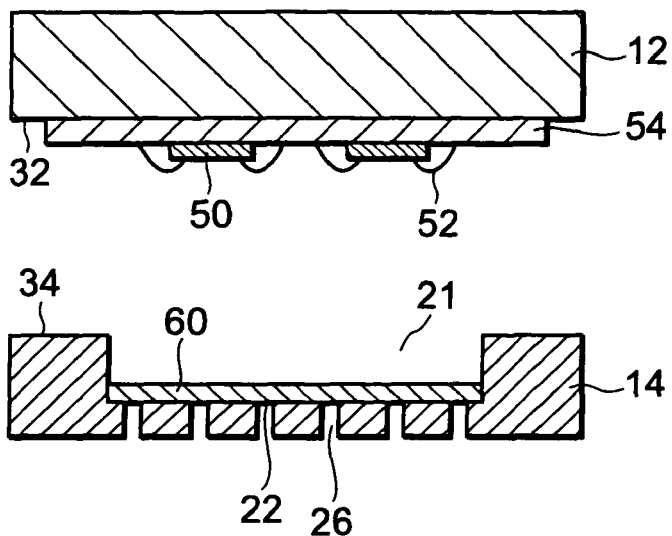
FIGS. 5A to 5C are explanatory diagrams showing a method of manufacturing a semiconductor device according to the present embodiment.
Figure 5B:
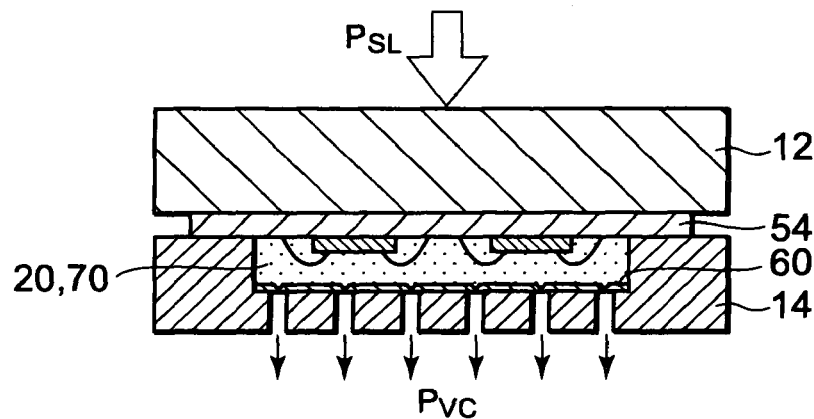
Figure 5C:
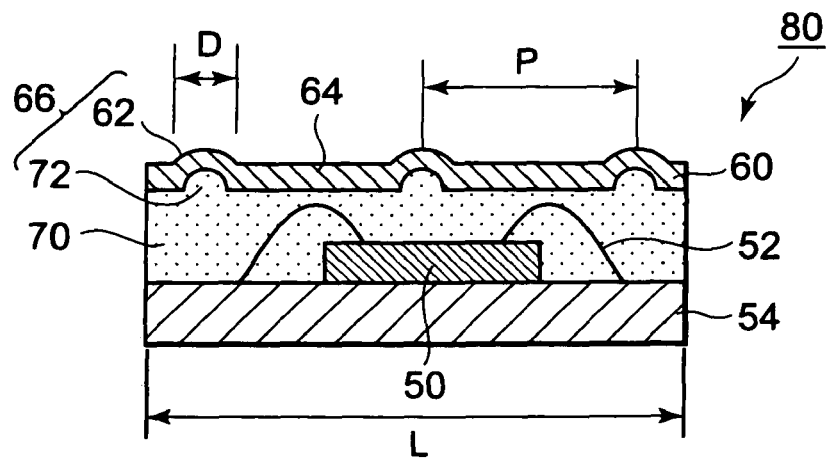

FIGS. 5A to 5C are explanatory diagrams showing a method of manufacturing the semiconductor device 80 according to the present embodiment.

Figure 6:
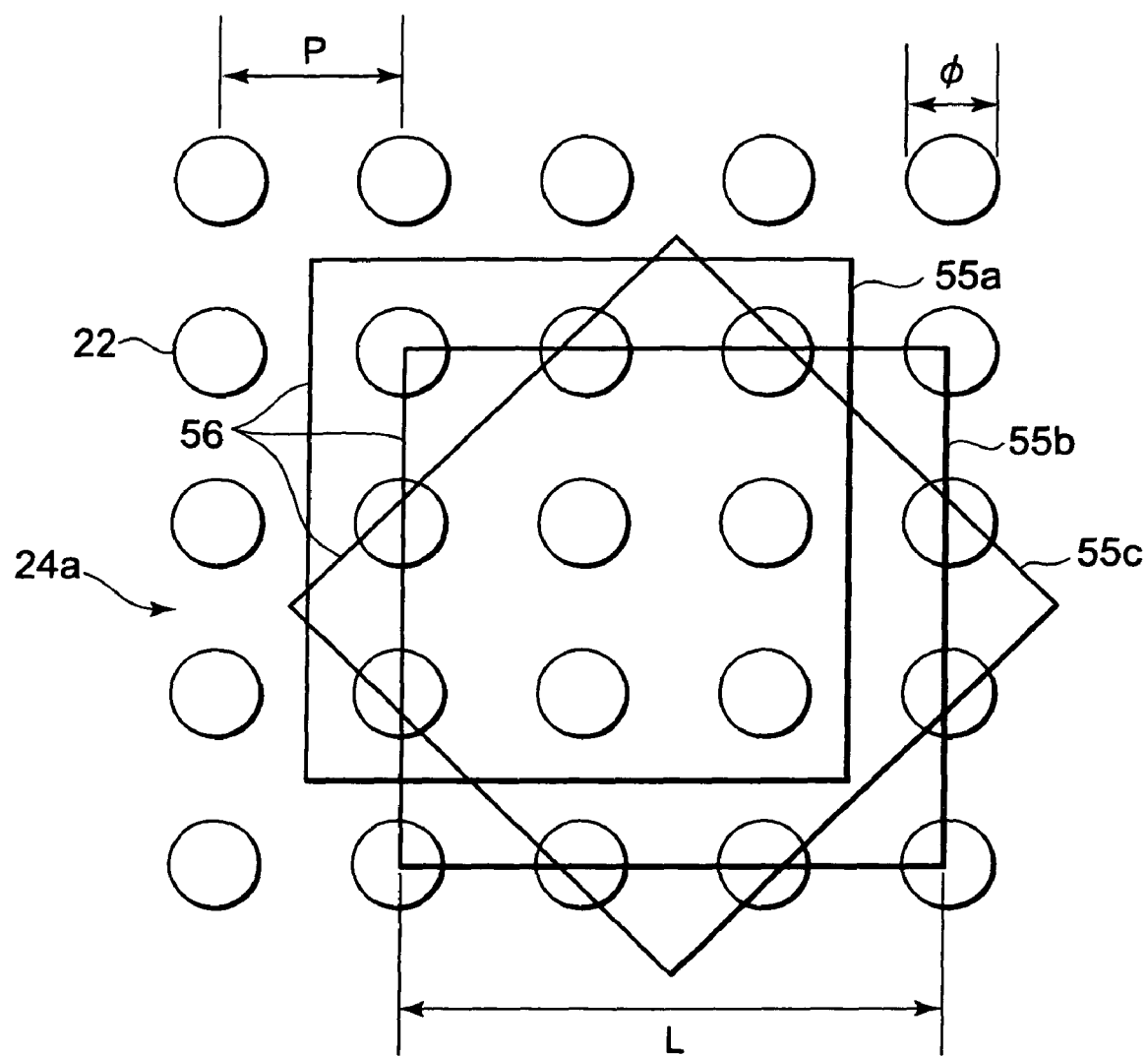
FIG. 6 is a schematic view showing a state in which apertures dispersion-formed on a cavity inner face have been aligned with unit product areas.

FIG. 6 is a schematic view showing a state in which apertures 22 dispersion-formed on the cavity inner face 24 have been aligned with the unit product area 55 of the substrate 54.

First, an overview of the method of manufacturing the semiconductor device 80 according to the present embodiment will be given.

In the method of manufacturing the semiconductor device 80 according to the present embodiment, the planar heat spreader 60 is set on the cavity inner face 24 on which a plurality of apertures 22 is dispersion-formed at pitchs P smaller than the unit package size L of the semiconductor device 80 to be seal-molded, and by pressure-welding the heat spreader 60 to resin (the molding resin 70) filling the cavity 20 and which seals the semiconductor chips 50, protrusions 66 corresponding to the apertures 22 are formed on the heat spreader 60 and the molding resin 70.

Next, the method of manufacturing the semiconductor device 80 according to the present embodiment will be described in detail.

FIG. 5A is a diagram showing a state where a substrate placement step in which the substrate 54 mounted with the semiconductor chips 50 is placed on the second molding die 12 and an setting step in which the planar heat spreader 60 is set on the inner face (the opposing face 24a) of the cavity 20 have been performed.

The first pressing face 32 of the second molding die 12 is dimensioned so as to encapsulate the substrate 54. The entire product area 54a and the clamp area 54b (refer to FIG. 4) of the substrate 54 are set on the first pressing face 32 (placement step). Moreover, an adsorption hole, not shown, may be provided inside the second molding die 12 so as to adsorb and hold the substrate 54 to the first pressing face 32.

The cavity recess 21 of the first molding die 14 is dimensioned so as to encapsulate the product area 54a. The planar heat spreader 60 is then set on the opposing face 24a (setting step). As for the specific dimensions of the heat spreader 60, the heat spreader 60 is dimensioned so as to be equal to or smaller than the opposing face 24a and to conceal all apertures 22.

At this point, by suctioning the vents 26 using a suction apparatus such as a vacuum pump (not shown) and placing the inside under negative pressure, the heat spreader 60 is adsorbed to the apertures 22 and aligned with respect to the opposing face 24a.

FIG. 5B is a diagram showing a state where a pressing step is performed in which the second molding die 12 and the first molding die 14 are pressed against each other, the semiconductor chip 50 is enclosed in the molding resin 70 filling the inside of the cavity 20 and the heat spreader 60 is pressure-welded to the molding resin 70 in order to mold the semiconductor device 80.

Through the pressing step, protrusions 66 corresponding to the apertures 22 are formed on the pressure-welded heat spreader 60 and the molding resin 70.

From the perspective of obtaining high thermal conductivity, a metallic material such as copper is used as the heat spreader 60. In addition, in order to obtain a uniform thermal diffusion force and heat radiating force for each semiconductor device 80, the heat spreader 60 should preferably be planar with a uniform thickness (t). Furthermore, surface preparation such as plating and roughening may be performed on the surface of the heat spreader 60.

While the thickness (t) of the heat spreader 60 is not particularly limited, a sheet member with a thickness of 0.05 mm to 0.5 mm is preferably used. Within this range, a thickness of 0.125 mm or greater is preferable from the perspective of ensuring sufficient heat capacity, while a thickness of 0.3 mm or less is preferable from the perspective of obtaining flexibility that enables localized bulging and deformation to form the protrusions 66 during the pressing step.

A thermosetting resin such as epoxy resin, mixed with a curing agent or a filler such as silica, is preferably used as the molding resin 70.

As for modes in which the semiconductor chips 50 are enclosed in the molding resin 70, either of the two roughly-classified methods of the transfer molding method and the compression molding method can be used.

In the transfer molding method, the second molding die 12 and the first molding die 14 are clamped together to form the cavity 20, and after supplying the molding resin 70 in a molten state through a runner communicating with the cavity 20, the second molding die 12 and the first molding die 14 are pressed.

In the compression molding method, in a state where the molding resin 70, preformed and half-molten, is set in the cavity recess 21 in advance, the second molding die 12 and the first molding die 14 are clamped and pressed against each other.

The second molding die 12 and the first molding die 14 are clamped in a state where the clamp area 54b of the substrate 54 that is mounted with the semiconductor chips 50 is held between the first pressing face 32 and the second pressing face 34. Consequently, the semiconductor chips 50 and the wires 52 mounted on the product area 54a are set inside the cavity 20 so as to oppose the heat spreader 60. In addition, because the clamp area 54b acts as a seal, no leakage of the molding resin 70 will occur from between the first pressing face 32 and the second pressing face 34.

Then, by filling the molding resin 70 between the substrate 54 and the heat spreader 60, the semiconductor chips 50 and the wires 52 are insulated and protected by the molding resin 70 and a plurality of semiconductor devices 80 (semiconductor packages) corresponding to the number of unit product areas 55 is integrally molded.

The pressing step is performed in a state where the molding resin 70 is heated to or beyond the glass transition temperature of thermosetting resin. As an example, the temperature can be raised to around 170 to 180° C. Melting the molding resin 70 in this heated state and loading high sealing pressure (PSL) on the molding die 10 prevents a void from being created inside the molding resin 70.

Then, by cooling the molding resin 70 to or below the glass transition temperature while still applying the sealing pressure (PSL) to harden the molding resin 70, the molding resin 70 and the heat spreader 60 are joined and a semiconductor package is molded.

Subsequently, the sealing pressure loaded on the molding die 10 is removed and the clamp holding the second molding die 12 and the first molding die 14 is released to separate the semiconductor package.

At this point, according to the method of manufacturing the semiconductor device 80 according to the present embodiment, removing the sealing pressure causes the heat spreader 60 that has been bulging into the vents 26 to attempt returning to its flat state due to elastic restoring force. However, since the bulging molding resin 70 has already hardened inside the protrusions 66, the heat spreader 60 generates biasing force in a direction that causes bulging sections 72 (refer to FIG. 5C) to aggregate and brings itself into close contact with the bulging sections 72.

In the present embodiment, the aforementioned press-welding is performed in a state where at least a part of the plurality of apertures 22 is suctioned from the outside of the cavity 20 and the heat spreader 60 is adsorbed against the cavity inner face 24.

As shown in FIG. 5B, by vacuum-suctioning the vents 26, suctioning pressure (PVC) is loaded on the heat spreader 60 that is exposed at the apertures 22. It should be noted that, as far as the present embodiment is concerned, vacuum-suctioning the vents 26 signifies forming negative pressure with respect to atmospheric pressure and the degree of vacuum is arbitrary.

As shown, in the present embodiment, due to sealing pressure (PSL) loaded on the molding die 10 and suctioning pressure (PVC) that suctions the vents 26, the heat spreader 60 exposed at the apertures 22 are bulged into the vents 26 to form protrusions 66, thereby obtaining strong joining force between the heat spreader 60 and the molding resin 70.

<Semiconductor Device>

FIG. 5C is a cross-sectional view of the semiconductor device 80 created by singulating a semiconductor package, collectively seal-molded using the MAP method, by dicing into respective unit product areas 55. FIG. 5C is a vertical inversion of FIG. 5B.

The semiconductor device 80 obtained by the manufacturing method according to the present embodiment includes: the semiconductor chip 50; the molding resin 70 sealing the semiconductor chip 50; and the heat spreader 60 opposing the semiconductor chip 50 and joined to the molding resin 70, wherein the heat spreader 60 is provided with a plurality of protrusions 66 formed so as to bulge outward.

In addition, flat sections 64 are formed on the heat spreader 60 between the bulging sections 62.

The semiconductor chip 50 is a so-called wire-bonded semiconductor chip and whose entirety with the exception of a bottom face on the side of the substrate 54 is sealed by the molding resin 70.

In the semiconductor device 80 according to the present embodiment, the molding resin 70 bulges out in correspondence to the protrusions 66 of the heat spreader 60 to form bulging sections 72.

In addition, protrusions 66 are constructed on the semiconductor device 80 by the bulging sections 62 and 72 protruding towards the front face of the heat spreader 60. The protrusions 66 are formed dispersed across the entire face of the heat spreader 60.

As an example, the semiconductor device 80 can be manufactured by the manufacturing method described above.

Alternatively, the semiconductor device 80 according to the present embodiment can be created by joining the heat spreader 60, on which bulging sections 62 have been formed in advance by drawing or the like, to the molding resin 70.

Four or more protrusions 66 are formed on each semiconductor device 80 according to the present embodiment. By providing each unit package with four or more protrusions 66 and, in particular, by dispersion-forming such protrusions 66 in a two-dimensional planar arrangement or, in other words, in an arrangement other than a single line, a high joining force between the heat spreader 60 and the molding resin 70 can be obtained across the entire face of the heat spreader 60.

In the case of the semiconductor device 80 according to the present embodiment shown in FIG. 5C, three protrusions 66 on each side of a unit package for a total of nine protrusions 66 are dispersion-formed.

In addition, the outside diameter (D) of a protrusion 66 is preferably 5 to 50 times the thickness (t) of the heat spreader 60. Furthermore, the pitch (P) between protrusions 66 or, in other words, the center-to-center distance between protrusions 66 is preferably 10 to 100 times the thickness (t) of the heat spreader 60.

<Mode of Formation of Aperture>

A mode of formation of the apertures 22 of the first molding die 14 which is capable of forming preferable protrusions 66 on the semiconductor device 80 will be described below.

The apertures 22 preferably have a circular shape. By having the apertures 22 take a circular shape or, in other words, by providing the apertures 22 with no corners, a void is more unlikely to occur in the protrusions 66 created by bulging of the heat spreader 60. In addition, by having the apertures 22 take a circular shape, stress concentration acting on the bulging sections 62 of the heat spreader 60 during seal-molding is leveled, thereby preventing breakage of the heat spreader 60. Furthermore, by having the protrusions 66 formed on the semiconductor device 80 take a circular shape, the protrusions 66 can be prevented from becoming a starting point of peeling between the heat spreader 60 and the molding resin 70.

Moreover, the pitch (P) between adjacent apertures 22 or, in other words, the center-to-center distance between apertures 22 is preferably 1.1 times the diameter ($\phi$) of the apertures 22 or greater so as to prevent the apertures 22 from coming into contact with each other. In addition, from the perspective of ensuring sufficient strength of the first molding die 14 with respect to the load of sealing pressure (PSL) and forming the flat sections 64 and the bulging sections 62 in a balanced manner to obtain high joining force of the heat spreader 60, the center-to-center distance between the apertures 22 is preferably 2 times the diameter ($\phi$) of the apertures 22 or greater. The pitch between the apertures 22 of the first molding die 14 corresponds to the pitch between the protrusions 66 of the semiconductor device 80.

The apertures 22 are evenly dispersion-arranged without excessive unevenness on the opposing face 24a of the cavity inner face 24 in a regular pattern such as a grid, a zigzag, or the like, or in a random pattern.

With the first molding die 14 according to the present embodiment, three or more apertures 22 per the unit package size L are respectively dispersion-formed on the opposing face 24a thereof in directions intersecting each other.

Specifically, as shown in FIG. 6, apertures 22 are arranged in an orthogonal grid pattern on the cavity inner face 24 according to the present embodiment. By dispersing the apertures 22 at a number density of three or more for each unit package size L, the unit product area 55 is to contain at least four apertures 22 regardless of the alignment and angle of the unit product area 55 with respect to the opposing face 24a.

In other words, by conforming a side 56 to the alignment direction of the apertures 22 while displacing the side 56 with respect to the apertures 22 as in the case of a rectangular unit package area 55a, three apertures 22 per side for a total of nine apertures 22 are to be contained in the unit package area 55a. In contrast, even when conforming the side 56 to the alignment direction of the apertures 22 and overlapping the side 56 with the apertures 22 as in the case of the unit package area 55b, two apertures 22 per side for a total of four apertures 22 are to be completely contained in the unit package area 55b.

In addition, even when arranging the side 56 and the alignment direction of the apertures 22 to intersect each other and overlapping the side 56 with the apertures 22 as in the case of a unit package area 55c, a total of four apertures 22 are to be completely contained in the unit package area 55c in the same manner.

As described above, by providing the apertures 22 at an arrangement density of three or more per the unit package size L in each direction, at least two apertures 22 in each of two directions for a total of four or more protrusions 66 are to be formed on the heat spreader 60 of the individual semiconductor devices 80 to be seal-molded.

Advantages of the aforementioned present embodiment will be described.

The semiconductor device 80 according to the present embodiment includes: the semiconductor chip 50; the molding resin 70 sealing the semiconductor chip 50; and the heat spreader 60 opposing the semiconductor chip 50 and joined to the molding resin 70, wherein the heat spreader 60 is provided with a plurality of protrusions 66 formed so as to bulge outward. With the semiconductor device 80 configured as described above, since the heat radiation area increases in comparison to a flat heat spreader, favorable thermal diffusion force and heat radiating force can be obtained.

In addition, in the semiconductor device 80 according to the present embodiment, the molding resin 70 bulges out in correspondence to the protrusions 66 of the heat spreader 60. Consequently, the heat spreader 60 and the molding resin 70 are to be favorably joined due to an anchoring effect. Furthermore, since interfaces of the heat spreader 60 and the molding resin 70 intersect at the flat sections 64 and the bulging sections 62, an advantage may be gained in that an expansion of peeling of the heat spreader 60 at the flat sections 64 is arrested by the bulging sections 62.

Moreover, compared to the case of a flat heat spreader, the contact area between the molding resin 70 and the heat spreader 60 is increased, resulting in favorable thermal diffusion force and heat radiating force.

In addition, in the semiconductor device 80 according to the present embodiment, the outside diameter (D) of the protrusions 66 is 5 to 50 times the thickness (t) of the heat spreader 60. By selecting such a range, when pressing the molding resin 70 with a standard sealing force against the heat spreader 60 made of a common metal material, the heat spreader 60 can be made to bulge in a favorable manner at the protrusions 66. If the diameter D is excessive with respect to the thickness t, the amount of bulging may be too great and may result in breakage of the heat spreader 60. In addition, if the diameter D is too small with respect to the thickness t, the heat spreader 60 may be unable to bulge sufficiently and the advantages described above cannot be achieved.

The first molding die 14 constituting the molding die 10 according to the present embodiment includes a plurality of apertures 22 dispersion-formed at pitchs P smaller than the unit package size L of the semiconductor device 80 to be molded on the cavity inner face 24. According to such a configuration, when combining the first molding die 14 in which the heat spreader 60 is set on the cavity inner face 24 and the second molding die 12 to which the semiconductor chip 50 is set, and pressure-welding the molding resin 70 filling the cavity 20 against the heat spreader 60, the heat spreader 60 bulges out together with the molding resin 70 at localized areas corresponding to the apertures 22.

In other words, with the molding die 10 according to the present embodiment, protrusions 66 can be formed on the heat spreader 60 and the molding resin 70 when seal-molding the semiconductor device 80.

In addition, due to the elastic restoring force of the bulged heat spreader 60, the protrusions 66 of the semiconductor device 80 subsequent to seal-molding are subject to biasing force in a direction in which the bulging sections 72 of the molding resin 70 are aggregated or, in other words, a direction in which the bulging sections 62 and 72 come into close contact with each other. Accordingly, higher joining force can be obtained compared to, for example, a case where molding resin is joined to the heat spreader 60 on which asperities have been formed in advance.

Furthermore, with the molding die 10 according to the present embodiment, protrusions 66 are formed by pressing out the planar heat spreader 60 set on the cavity inner face 24 into the apertures 22 with the molding resin 70. In other words, since the heat spreader 60 that initially comes into contact with the molding resin 70 is flat, there is no risk of voids attributable to poor contact between the heat spreader 60 and the molding resin 70 forming in the protrusions 66. In addition, according to the present embodiment in which the formation of protrusions 66 on the semiconductor device 80 and the joining of the heat spreader 60 and the molding resin 70 are concurrently performed, since there is no need to form bulging sections 62 beforehand on the heat spreader 60 prior to molding, seal-molding of the semiconductor device 80 can be performed in a smaller number of steps.

As described above, with the molding die 10 according to the present embodiment, a strong joint can be achieved between the heat spreader 60 and the molding resin 70. Therefore, the molded semiconductor device 80 is highly resistant to peeling of the heat spreader 60 and the molding resin 70, and since high thermal conductivity is realized, heat generated on the semiconductor chip 50 can be favorably diffused by the heat spreader 60. In addition, with the molding die 10 according to the present embodiment, even from the perspective of the heat spreader 60 being formed on the entire upper face of the molding resin 70, an even greater heat diffusion/discharge surface can be secured.

Furthermore, in the molding die 10 according to the present embodiment, the pitch P between apertures 22 provided on the cavity inner face 24 is arranged so as to be smaller than the unit package size L. Accordingly, for example, when a case of molding a general rectangular semiconductor package (semiconductor device 80) is to be envisioned, a plurality of protrusions 66 are to be always formed in the directions of the respective sides on the semiconductor package even if displacement occurs between the semiconductor chip 50 and the heat spreader 60. In other words, even if the semiconductor chip 50 and the second die 12, the heat spreader 60 and the first molding die 14, and the second molding die 12 and the first molding die 14 are not respectively aligned at high accuracy, a molded semiconductor package will always be provided with four or more protrusions 66.

Accordingly, even when collectively sealing a plurality of semiconductor chips 50 using the MAP method and simultaneously molding a plurality of semiconductor packages, the heat spreader 60 can be favorably joined on the entire upper face of the molding resin 70 without having to rigorously align the substrate 54 mounted with the semiconductor chip 50 and the heat spreader 60. Therefore, a seal-molding step of the semiconductor chip 50 can be performed in a remarkably prompt manner.

Moreover, when molding a semiconductor device 80 with a greater unit package size than the pitch P between the apertures 22, the molding die 10 according to the present embodiment can be used regardless of the dimensions of the semiconductor chip 50 or the semiconductor device 80. This is also attributable to the fact that, as described above, the heat spreader 60 can be favorably joined on the entire upper face of the molding resin 70 without having to rigorously align the semiconductor chip 50 and the heat spreader 60. In addition, since the molding die 10 can be used versatilely, an advantage can be achieved in that the molding die 10 need not be individually designed and fabricated for each type of the semiconductor chip 50 or the semiconductor device 80, or be frequently replaced during seal-molding.

Furthermore, in the molding die 10 according to the present embodiment, among the cavity inner face 24 of the first molding die 14, the apertures 22 are uniformly dispersion-formed on the opposing face 24a opposing the semiconductor chip 50. Accordingly, protrusions 66 are to be dispersed in a well-balanced manner both when a plurality of semiconductor chips 50 are to be collectively seal-molded using the MAP method and when an individual semiconductor chip 50 is to be individually seal-molded.

Moreover, in the molding die 10 according to the present embodiment, three or more apertures 22 per the unit package size L are respectively dispersion-formed on the opposing face 24a of the first molding die 14 in directions intersecting each other. Due to such a configuration, at least two protrusions 66 are to be formed in each direction on the semiconductor package regardless of the alignment or the angle of the semiconductor chip 50 set on the second molding die 12 and the heat spreader 60 set on the first molding die 14.

In addition, in the molding die 10 according to the present embodiment, at least a part of the plurality of apertures 22 communicates with the outside of the cavity of the first molding die 14. Accordingly, vacuum suction can be performed on the apertures 22 communicating with the outside. By subjecting the apertures 22 to vacuum suction, the heat spreader 60 can be pressed against the molding resin 70 while adsorbing and fixing the heat spreader 60 against the cavity inner face 24 of the first molding die 14. In addition, by subjecting the apertures 22 to vacuum suction, the surface of the heat spreader 60 can be locally suctioned to promote bulging and the formation of the protrusions 66.

Furthermore, in the molding die 10 according to the present embodiment, the pitch (P) between adjacent apertures 22 is 1.1 times the diameter ($\phi$) of the apertures 22 or greater. In addition, in the semiconductor device 80 according to the present embodiment, the pitch (P) between protrusions 66 is 10 to 100 times the thickness (t) of the heat spreader 60. By selecting such ranges, an excessive decrease in the strength of the first molding die 14 can be avoided. Moreover, by selecting such ranges, the influence of a deformation of a protrusion 66 of the heat spreader 60 on other adjacent protrusions 66 can be virtually ignored, thereby preventing a void attributable to poor contact between the heat spreader 60 and the molding resin 70 from being formed in the flat sections 64.

The present invention is not limited to the embodiment described above, and may include many modes such as modifications and variations insofar as the object of the present invention is achieved.

Second Embodiment

Figure 7A:
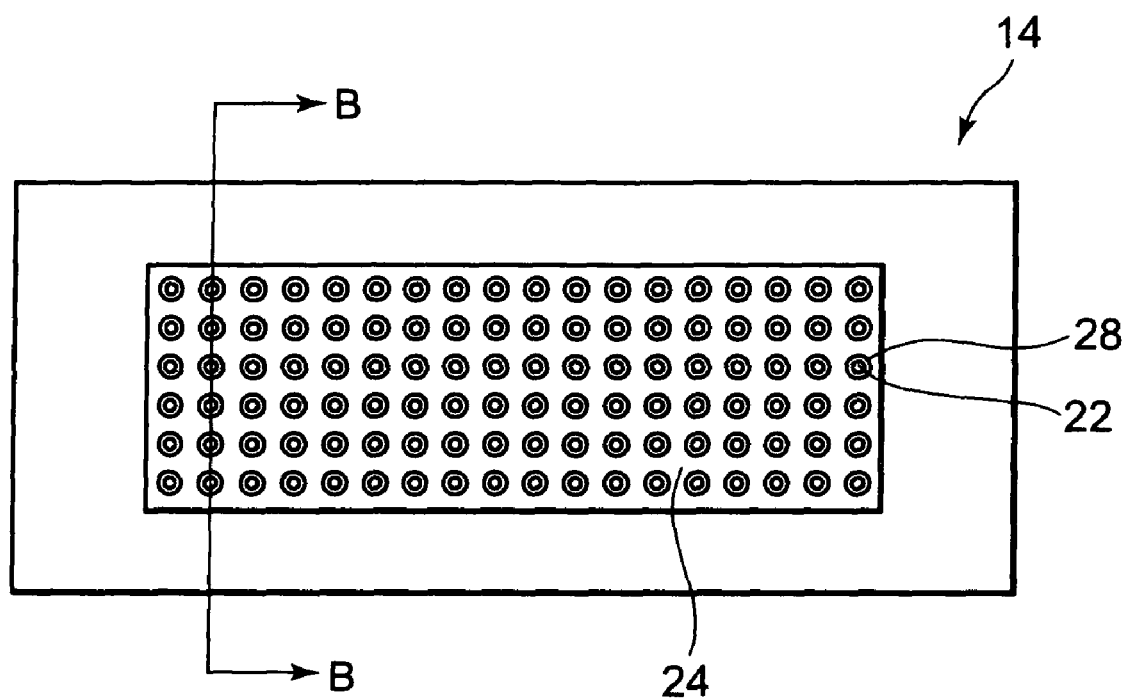
Figure 7B:
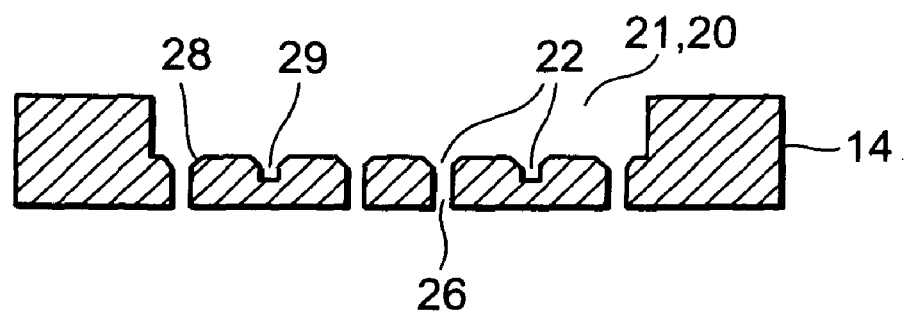
FIG. 7B is a B-B cross sectional view thereof.

FIG. 7A is a plan view of a first molding die 14 according to the present embodiment, while FIG. 7B is a B-B cross sectional view thereof.

In the first molding die 14 according to the present embodiment, apertures 22 are provided with tapers 28 whose diameter increases towards a cavity 20 (a cavity recess 21). Accordingly, since a heat spreader 60 bulges and deforms along the tapers 28 during pressing, initial deformation of the heat spreader 60 is facilitated. In addition, as bulging and deformation of the heat spreader 60 commence during pressing, bulging is suppressed in a small-diameter section of vents 26 which are a deep section of the tapers 28. As a result, excessive bulging and breakage of the heat spreader 60 at the apertures 22 can be prevented.

Furthermore, a part of the apertures 22 do not communicate with the outside of the first molding die 14 and form aperture ends of depressions 29 that are blind holes. Accordingly, by adsorbing and holding the heat spreader 60 with the vents 26 and preventing the depressions 29 from penetrating the first molding die 14, an excessive decrease in the strength of the first molding die 14 can be avoided. Moreover, by arranging the depressions 29 to have or exceed a prescribed depth, deformation of the heat spreader 60 that bulges into the depressions 29 due to sealing pressure (PSL) is not hindered by the repulsive force of air remaining inside the depressions 29.

What is claimed is:

1. A method of manufacturing a semiconductor device, said method comprising:
   setting a heat spreader, that comprises a plurality of apertures, on a face thereof in a cavity of a first die;
   filling resin into the cavity;
   setting a substrate mounted with a semiconductor chip in a second die; and
   pressure-welding the first die and the second die so that the semiconductor chip is embedded in the resin,
   wherein a plurality of concave portions is formed on a side of the heat spreader that faces the semiconductor chip, a plurality of convex portions is formed on another side of the heat spreader, and the plurality of concave portions and the plurality of convex portions are overlapped in a plan view.

2. The method of manufacturing a semiconductor device according to claim 1, wherein a plurality of semiconductor chips is mounted on the substrate, and a pitch between the apertures of the first die is smaller than a unit package size including the substrate and the semiconductor chip.

3. The method of manufacturing a semiconductor device according to claim 1, wherein at least a part of the plurality of apertures comprises through-holes.

4. The method of manufacturing a semiconductor device according to claim 1, wherein the pressure welding is performed in a state wherein the apertures, through-holes are suctioned from outside of the cavity.

5. The method of manufacturing a semiconductor device according to claim 1, wherein a surface of the heat spreader is contacted with the resin.

6. The method of manufacturing a semiconductor device according to claim 1, wherein said another side of the heat spreader opposes said side of the heat spreader.

7. The method of manufacturing a semiconductor device according to claim 1, wherein said another side of the heat spreader is exposed.

8. The method of manufacturing a semiconductor device according to claim 1, wherein the apertures comprise a taper whose diameter increases in a direction from said another side of the heat spreader to said side of the heat spreader.

9. A die for resin-sealing a substrate on which a semiconductor chip is mounted, the die comprising:
   a first die having a cavity for filling a resin and a second die for setting the substrate,
   wherein the first die comprises a plurality of apertures on a face thereof on which a planar heat spreader is set, and
   wherein the apertures comprise a taper whose diameter increases towards the cavity.

10. The die according to claim 9, wherein a plurality of semiconductor chips is mounted on the substrate, and a pitch between the apertures of the first die is smaller than a unit package size including the substrate and the semiconductor chip.

11. The die according to claim 9, wherein the apertures are uniformly dispersion-formed on an opposing face that opposes the semiconductor chip among an inner face of the cavity of the second die.

12. The die according to claim 10, wherein three or more apertures per unit package size are respectively dispersion-formed on the opposing face in directions intersecting each other.

13. The die according to claim 9, wherein at least a part of the plurality of apertures comprises through-holes.

14. The die according to claim 13, wherein at least other apertures among the plurality of apertures are not through-holes.

15. The melding die according to claim 13, wherein a pitch (P) between adjacent apertures among the plurality of apertures is 1.1 times a diameter (φ) of the apertures or greater.

16. The die according to claim 9, wherein a top surface of the heat spreader that faces the semiconductor chip comprises a plurality of concave portions.

17. The die according to claim 16, wherein a bottom surface of the heat spreader comprises a plurality of convex portions, the plurality of concave portions and the plurality of convex portions overlapping in a plan view.

18. The die according to claim 16, wherein a bottom surface of the heat spreader, which opposes the top surface the heat spreader, is exposed.

* * * * *